United States Patent
Endo et al.

(10) Patent No.: US 8,048,277 B2
(45) Date of Patent: Nov. 1, 2011

(54) MAGNET UNIT AND MAGNETRON SPUTTERING APPARATUS

(75) Inventors: Tetsuya Endo, Komae (JP); Einstein Noel Abarra, Hachioji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 13/058,709

(22) PCT Filed: Jul. 9, 2009

(86) PCT No.: PCT/JP2009/003206
§ 371 (c)(1),
(2), (4) Date: Apr. 11, 2011

(87) PCT Pub. No.: WO2010/021078
PCT Pub. Date: Feb. 25, 2010

(65) Prior Publication Data
US 2011/0180401 A1    Jul. 28, 2011

(30) Foreign Application Priority Data

Aug. 18, 2008   (JP) .................................. 2008-209964

(51) Int. Cl.
*C23C 14/35* (2006.01)
(52) U.S. Cl. .................................. 204/298.19; 204/298.2
(58) Field of Classification Search ............. 204/298.19, 204/298.2
See application file for complete search history.

(56) References Cited

U.S. PATENT DOCUMENTS

| | | | |
|---|---|---|---|
| 5,182,003 A | 1/1993 | Maass et al. | 204/298.23 |
| 7,531,071 B2 | 5/2009 | Deppisch et al. | 204/298.19 |
| 7,785,449 B2 | 8/2010 | Endo et al. | |
| 7,955,480 B2 | 6/2011 | Endo et al. | |
| 2010/0133090 A1 | 6/2010 | Endo et al. | |

FOREIGN PATENT DOCUMENTS

| | | |
|---|---|---|
| JP | 63-317671 A | 12/1988 |
| JP | 4-268075 A | 9/1992 |
| JP | 7-026202 B | 3/1995 |
| JP | 2001-020067 A | 1/2001 |
| JP | 2001-348663 A | 12/2001 |
| JP | 3-798039 B2 | 7/2006 |
| JP | 2006-291357 A | 10/2006 |

*Primary Examiner* — Rodney McDonald
(74) *Attorney, Agent, or Firm* — Fitzpatrick, Cella, Harper & Scinto

(57) ABSTRACT

A magnet unit, which can realize uniform film thickness distribution of a thin film formed on a substrate without increasing the length and width of a target. The magnet unit includes a peripheral magnet, which is disposed on the yoke on the back side of a cathode electrode so as to follow the outline of a target, and an inner magnet disposed in the peripheral magnet and having a polarity different from the polarity of the peripheral magnet. The magnet unit provides a magnetic track MT that is a set of regions which tangents of magnetic field lines M generated on the target parallels to the target surface. The magnet unit further includes n (n is a positive integer of two or more) extending magnetic pole portions and n−1 projecting magnetic pole portions, which form 2n−1 folded shape portions U at the both ends in the longitudinal direction of the magnetic track.

3 Claims, 16 Drawing Sheets

[FIG. 1]
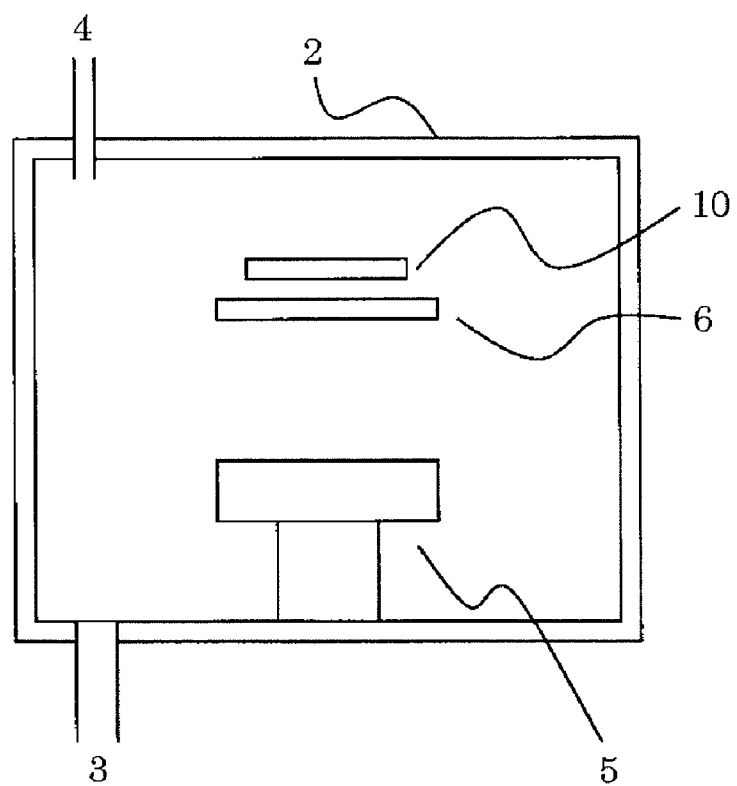

[FIG. 2]
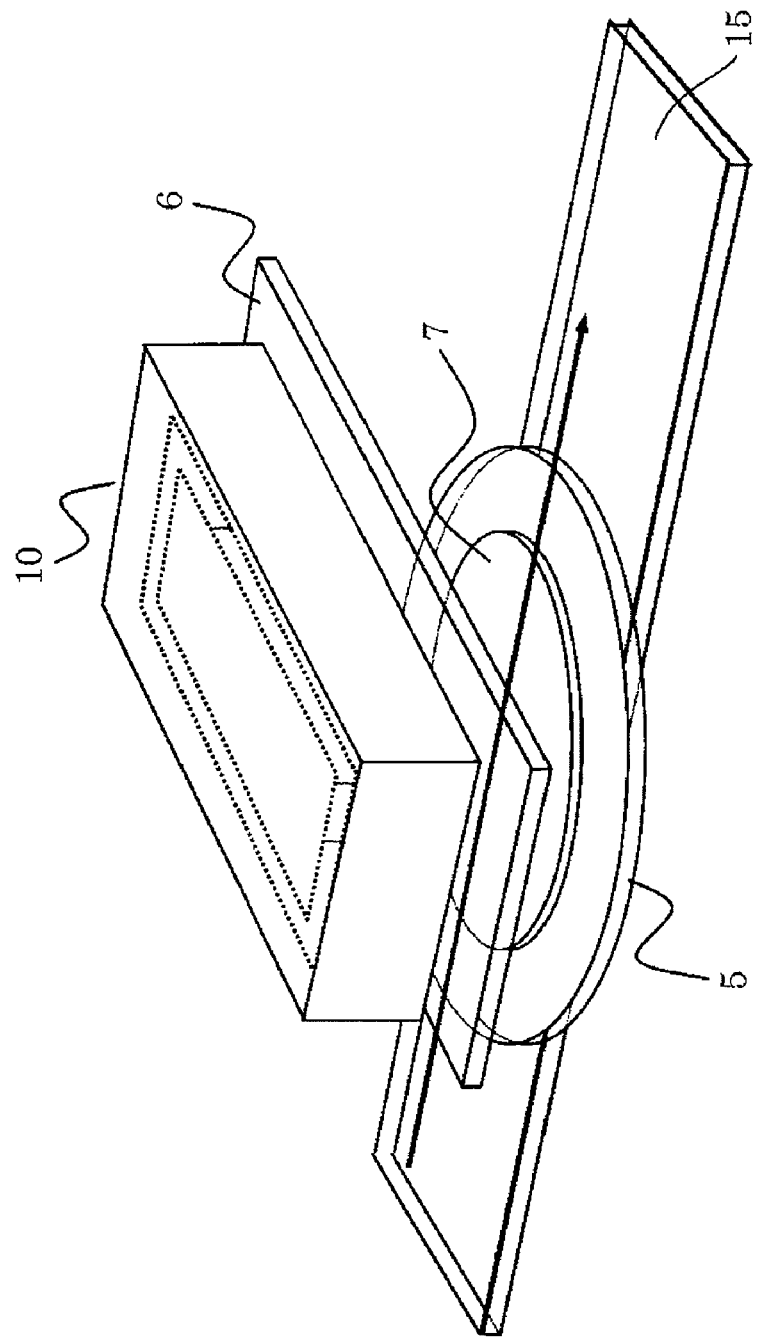

[FIG. 3]
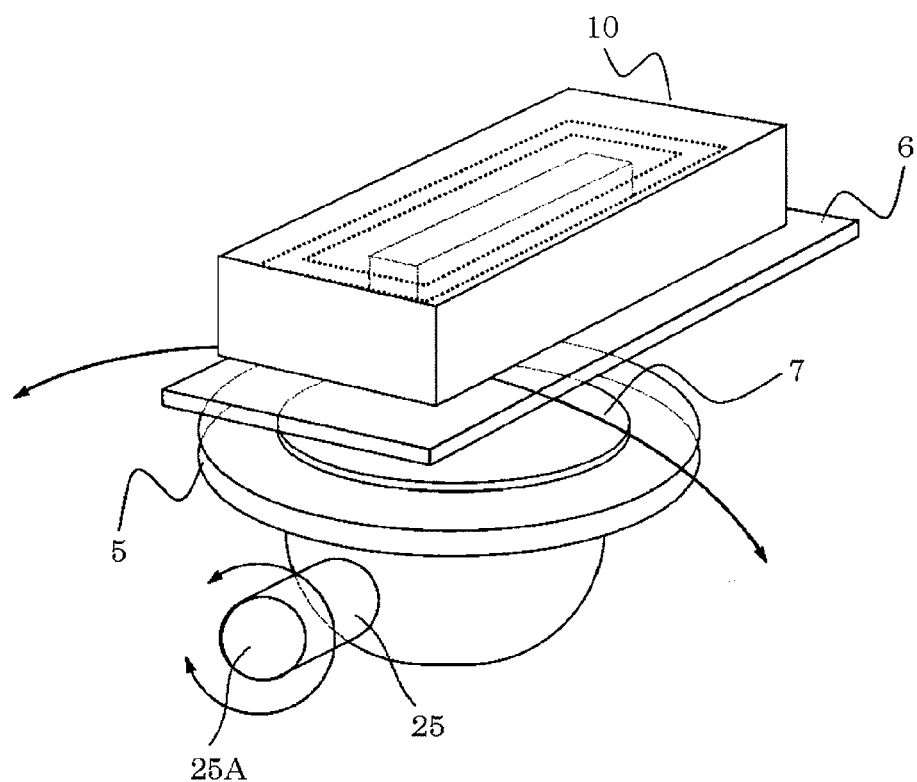

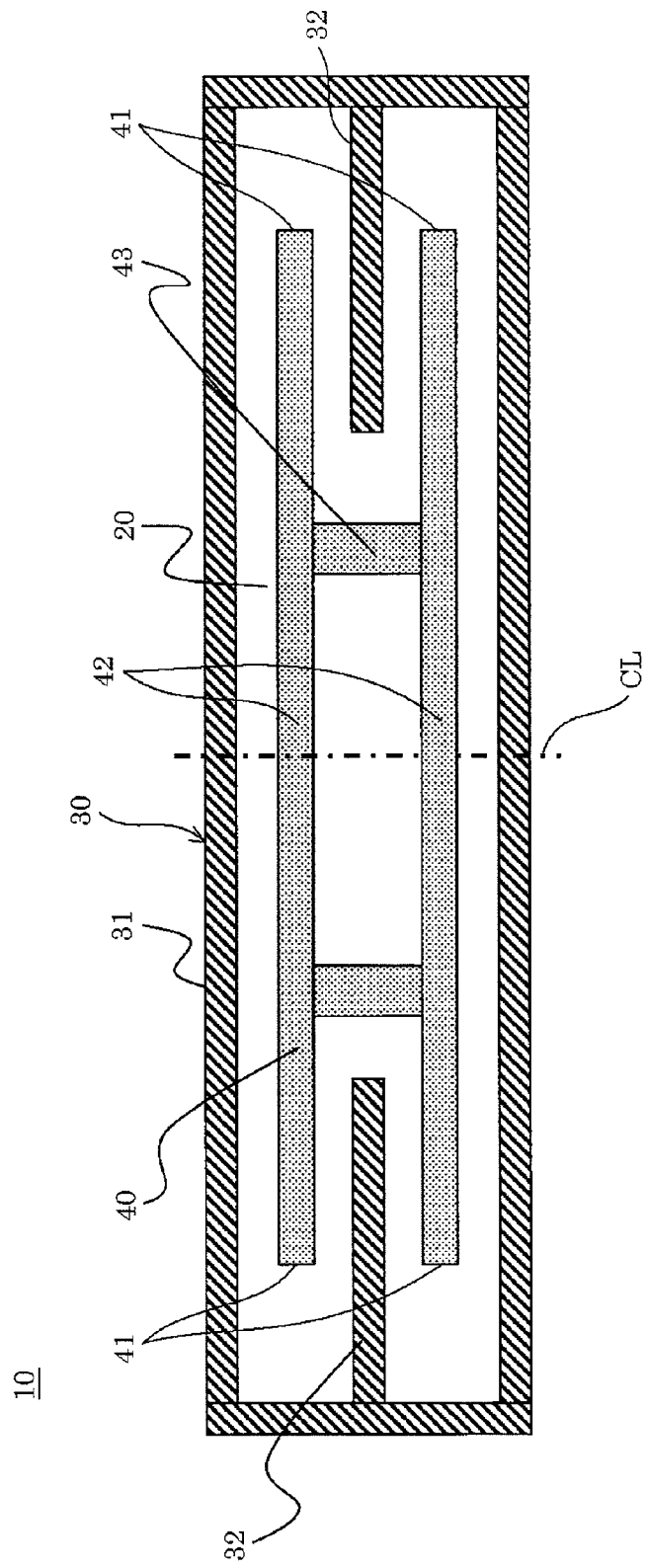
[FIG. 4]

[FIG. 5]
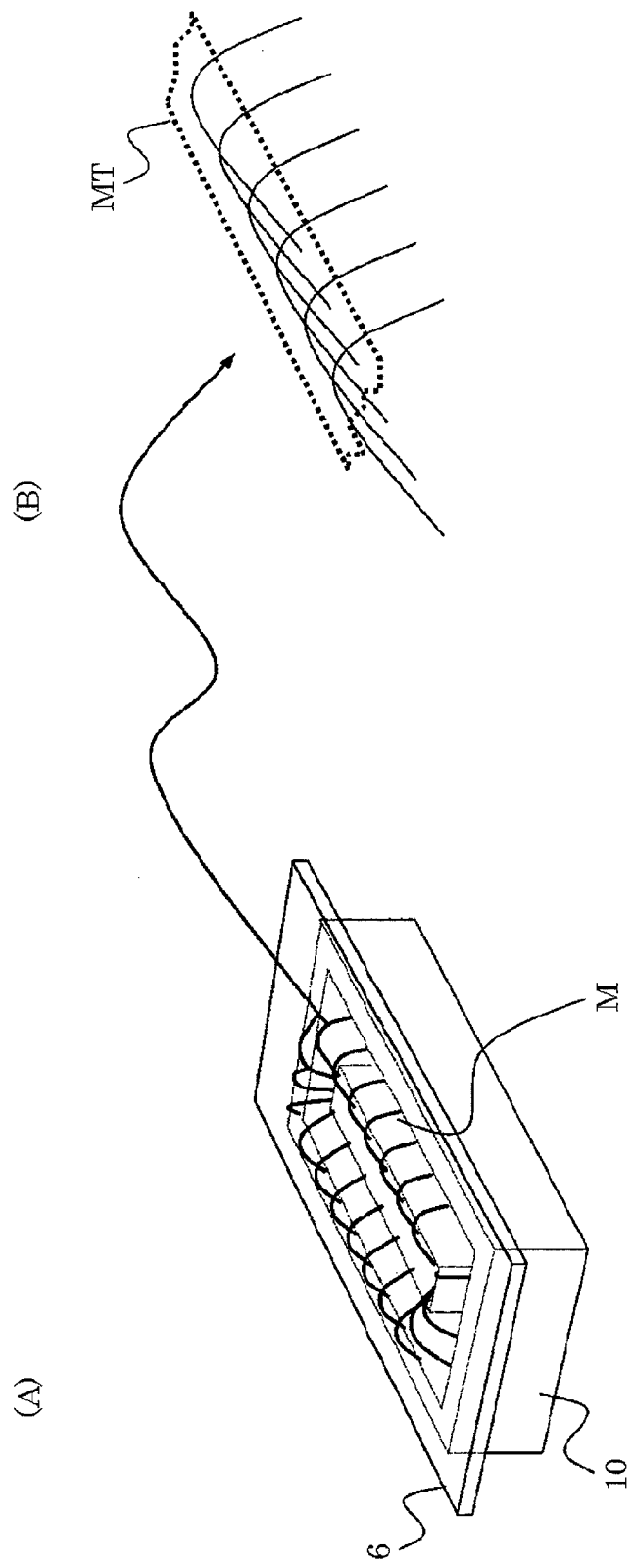

[FIG. 6]
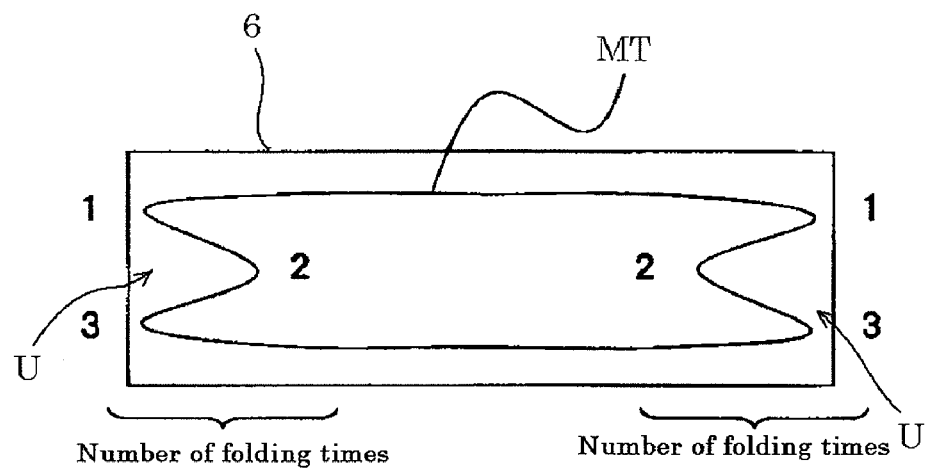

[FIG. 7]
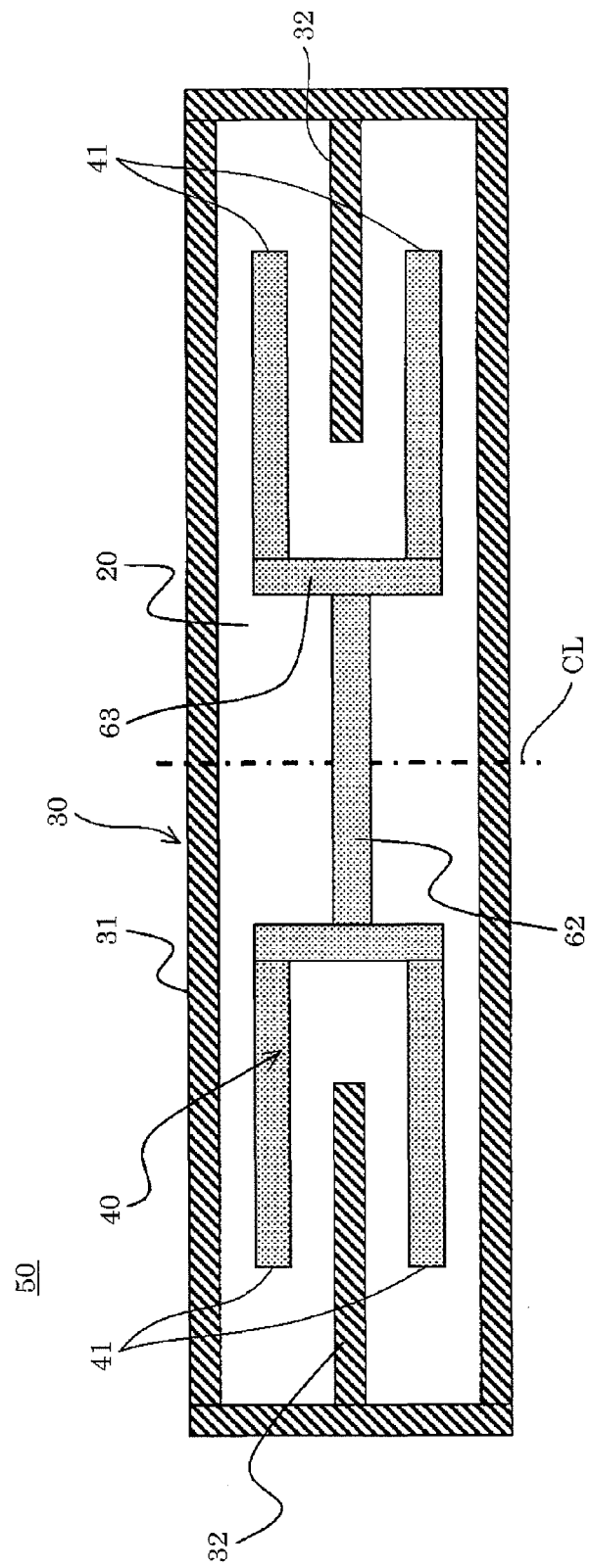

[FIG. 8]
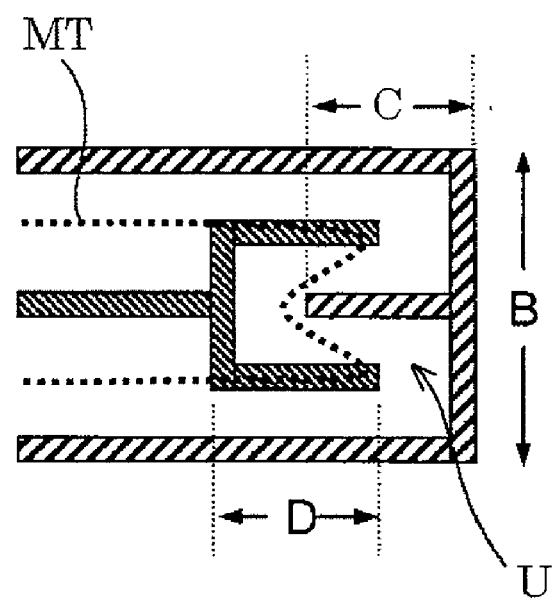

[FIG. 9]
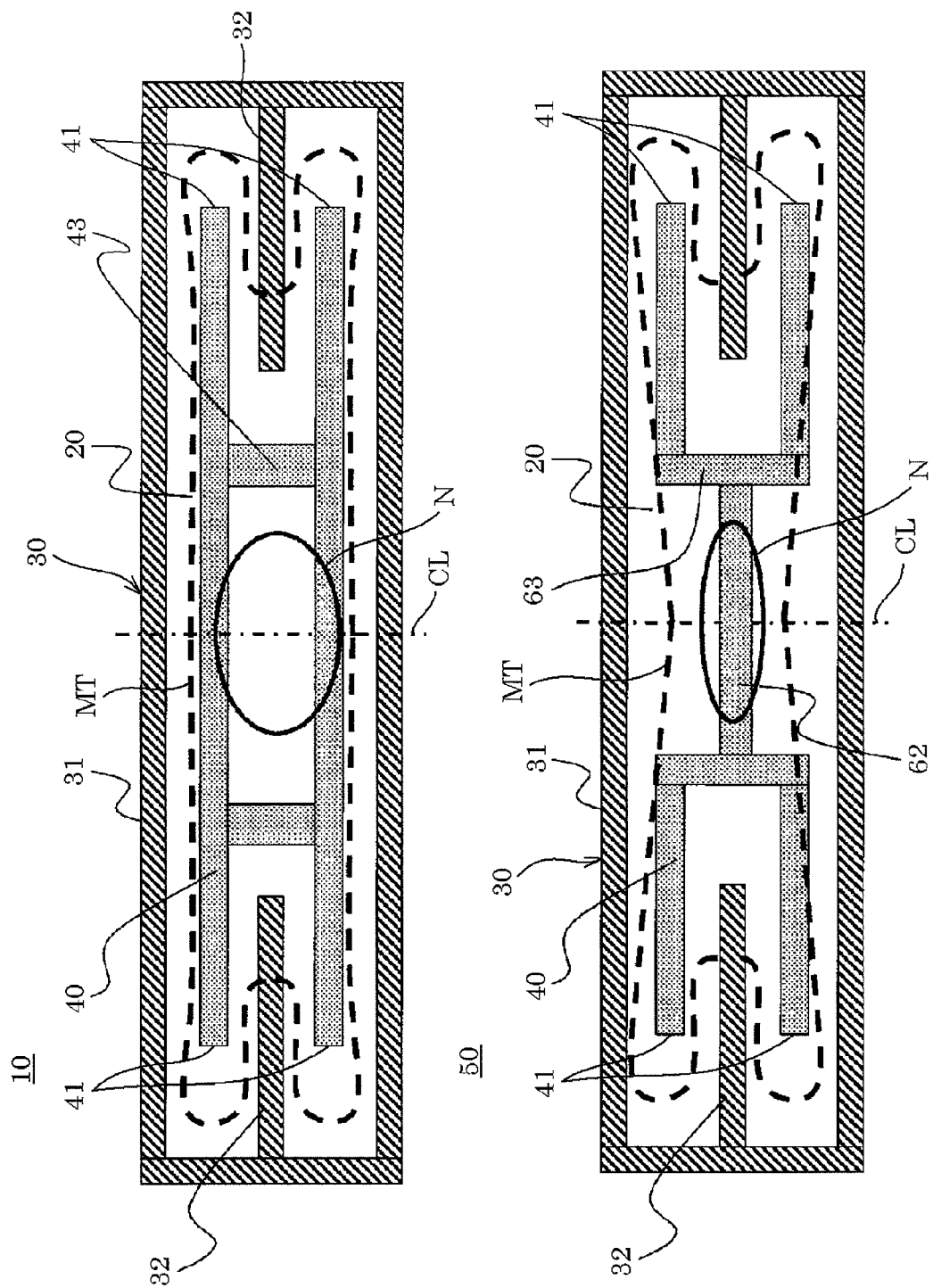

[FIG. 10]
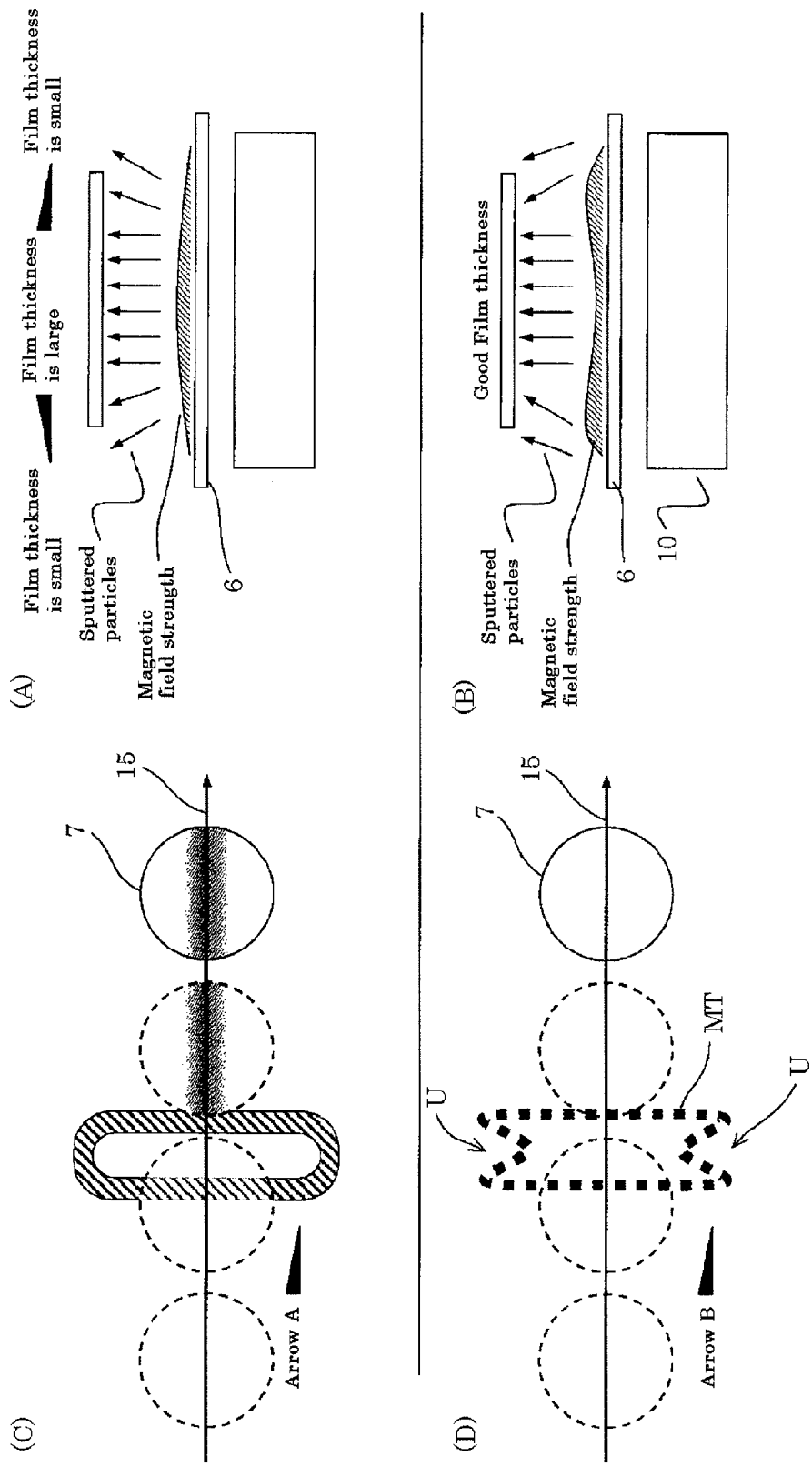

[FIG. 11]
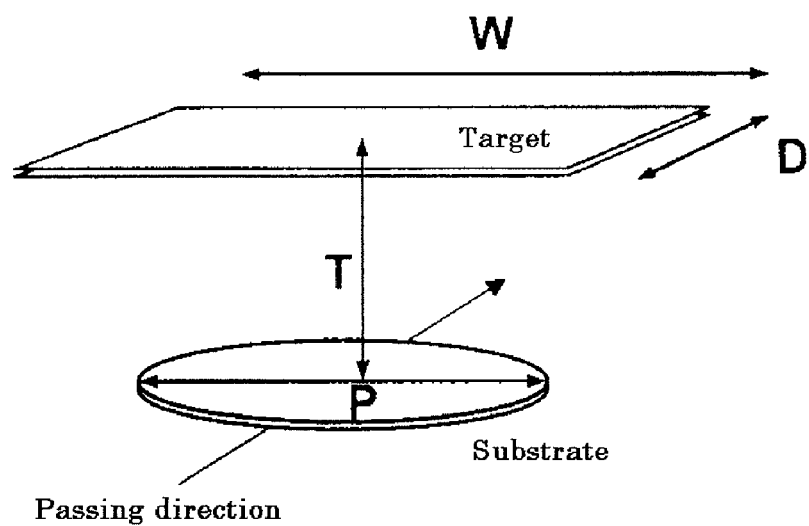

[FIG. 12]
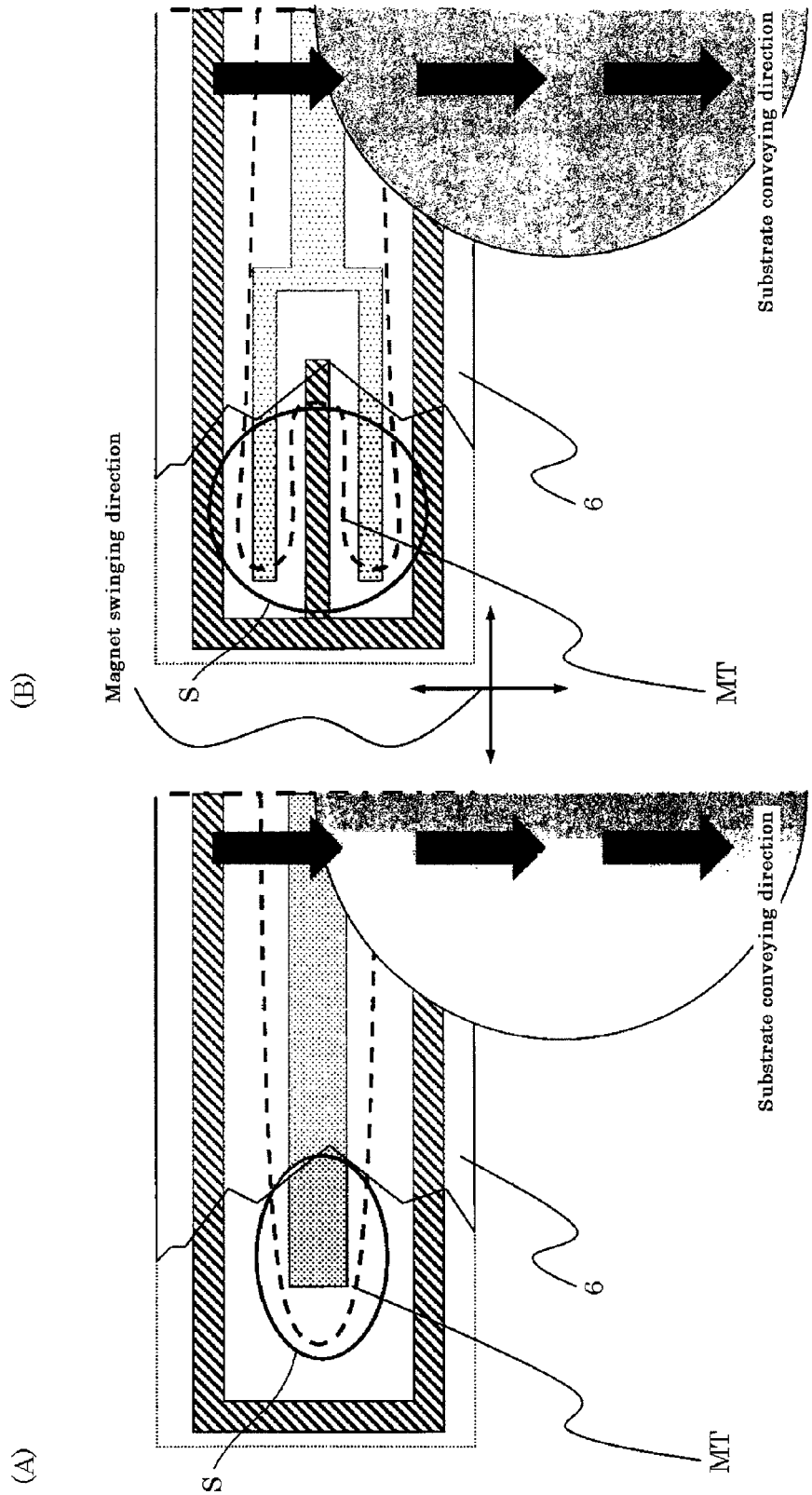

[FIG. 13]
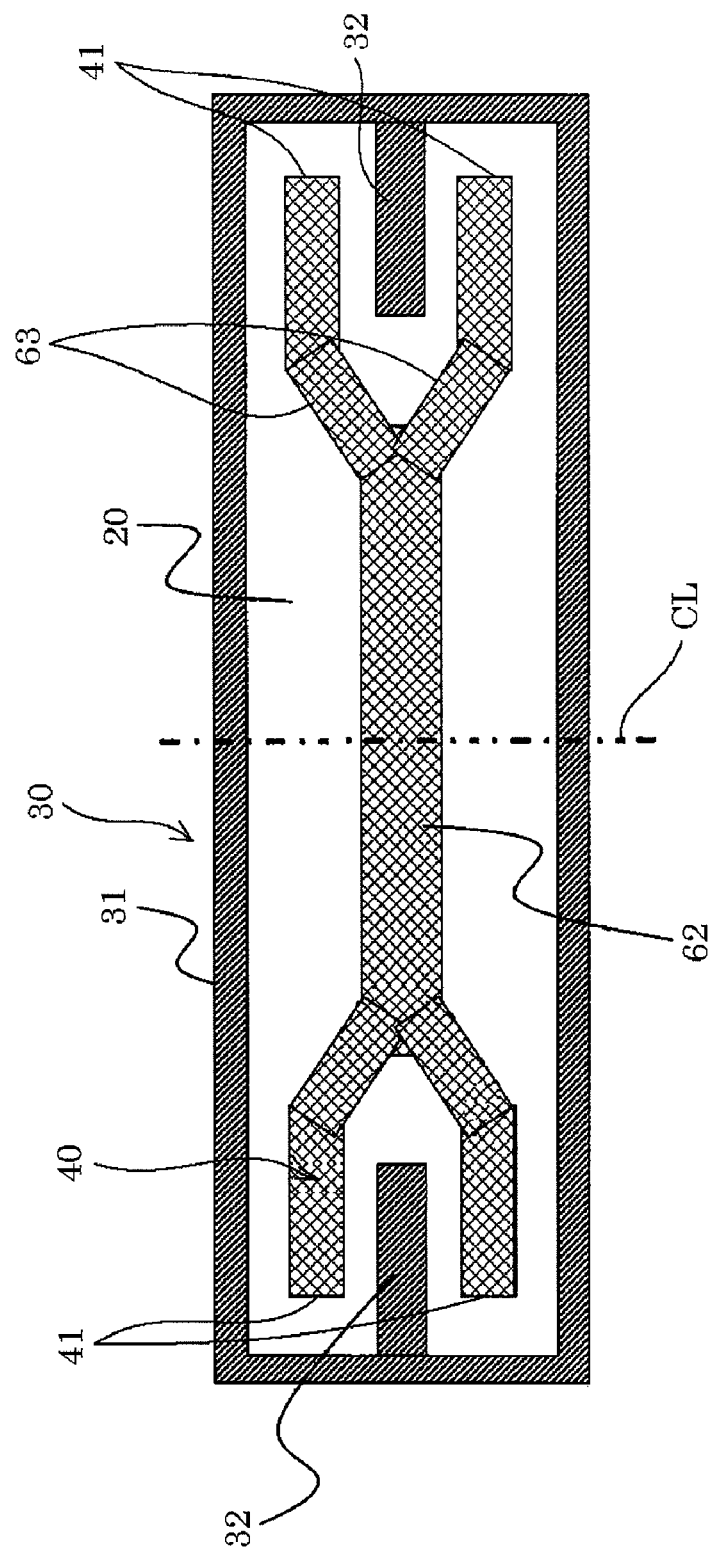

[FIG. 14]
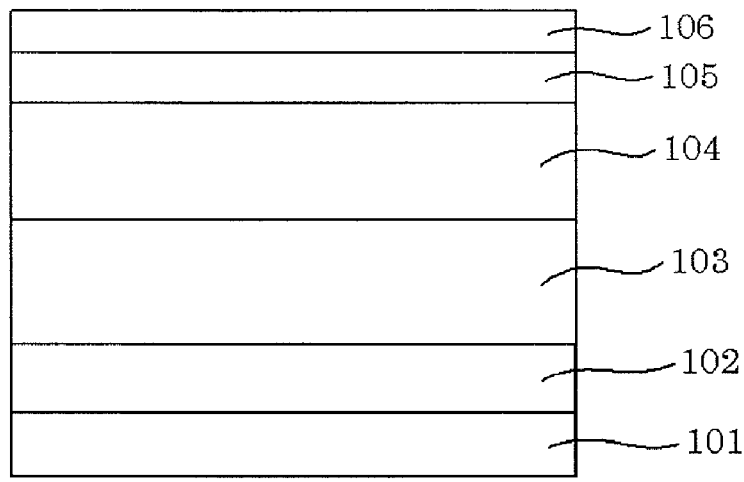

[FIG. 15]
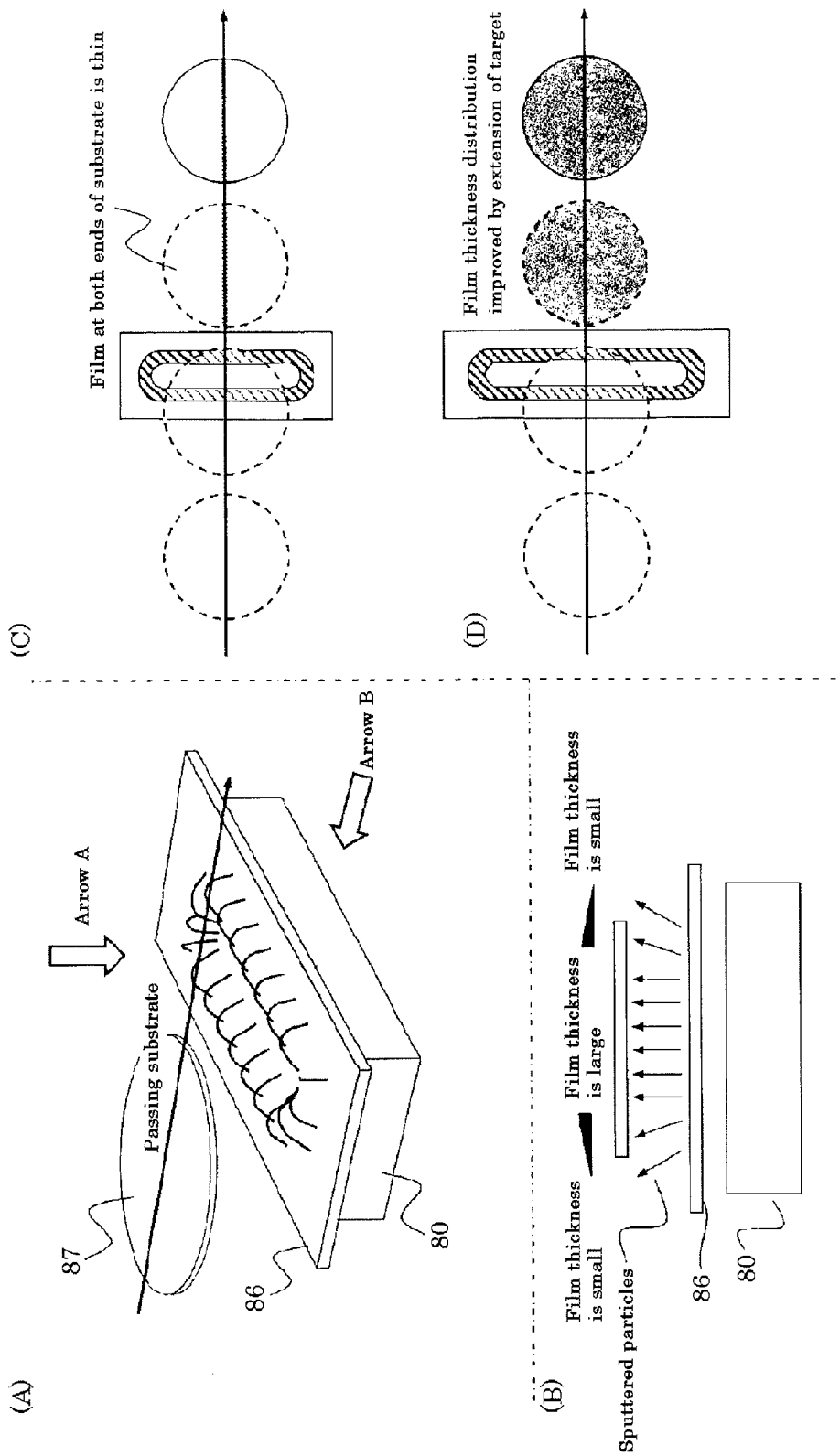

[FIG. 16]
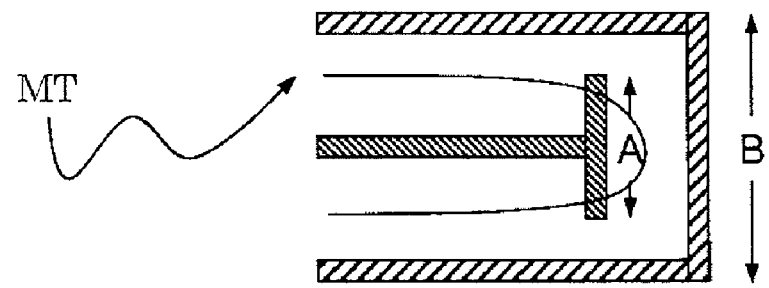

MAGNET UNIT AND MAGNETRON SPUTTERING APPARATUS

This application is a National Stage Entry under 35 U.S.C. §371 of International Application No. PCT/JP2009/003206, filed on Jul. 9, 2009, the content of which is incorporated herein by reference in its entirety.

TECHNICAL FIELD

The present invention relates to an improvement of a structure of a magnet unit disposed on the back side of a cathode electrode supporting a target on the front side in sputtering and a magnetron sputtering apparatus including the magnet unit.

BACKGROUND ART

In a magnetron sputtering apparatus, a magnet unit disposed on the back side of a cathode electrode supporting a target causes generation of magnetron on a discharge surface of the target to entrap a plasma, and, thus, to realize high density. Then, ions of the plasma generated in this apparatus collide with the target to thereby flick a target material. The target material is then adhered onto a substrate, whereby a thin film is formed.

Thus, a film formation rate strongly depends on an electric field and leakage magnetic field strength applied to a target. Especially, magnetron strength of a magnet unit strongly acts on a plasma density, and a film thickness distribution of a thin film formed on a substrate is influenced. In general, as the magnetron strength increases, the plasma density of the corresponding target is increased to increase a sputtering rate, and therefore, the film formation rate at the corresponding substrate position is also increased.

FIGS. 15A to 15D are explanatory views showing a magnetron sputtering apparatus that forms a film on a substrate while passing the substrate through the front of a target. For this type of pass-type film formation system, as shown in FIG. 15A, in general, a substrate 87 is passed so as to be perpendicular to the longitudinal direction of a rectangular target 86, as shown in FIG. 15A. Thus, as shown in FIG. 15C, the amount of sputtered particles from both ends in the longitudinal direction of the target 86 is small, and, as shown in FIG. 15B, the film thickness of the both ends of the substrate 87 is small, leading to deterioration of the film thickness distribution. Thus, as shown in FIG. 15D, in order to improve the deterioration of the film thickness distribution, the length in the longitudinal direction of the target 86 is increased, and a cathode electrode and a magnet unit 80 are extended so as to correspond to the target 86 to thereby respond to the deterioration of the film thickness distribution.

However, when the length of a target is increased in order to improve film thickness reduction at both ends of a substrate, not only consumption of a target material is increased, but also a running cost is increased.

Based on this point of view, in the prior art, there have been proposed various methods for adjusting the film thickness distribution of a thin film formed on a substrate. For example, a magnetic field strength on a target corresponding to a region on a substrate, in which the film thickness distribution of a thin film will be improved, is regulated by optimizing the height of each magnet, whereby the film thickness distribution is improved (see, Patent Document 1). Namely, in this film thickness adjusting method, the magnetic field strength on a target corresponding to a region on a substrate, in which the film thickness of a thin film is small, is increased, whereby the film formation rate is increased to increase the film thickness, and, thus, to improve the film thickness distribution.

There has been further provided a technique that in a magnet unit comprising a center magnet and an annular peripheral magnet surrounding the center magnet and having a polarity different from the polarity of the center magnet, the center magnet has T-shaped portions at its both ends, and magnetic tracks at the both ends are expanded, whereby the film thickness distribution of a thin film on a substrate is improved (see, Patent Document 2).

PRIOR ART DOCUMENTS

Patent Documents

[Patent Document 1] Japanese Examined Patent Application Publication No. 7-26202
[Patent Document 2] Japanese Patent No. 3798039

DISCLOSURE OF THE INVENTION

Problems to be Solved by the Invention

In the technique of Patent Document 1 for optimizing the height of magnets to regulate the magnetic field strength, when the target is a magnetic or ferromagnetic body, the leakage magnetic field strength on the target required for discharge ignition should be increased. For example, when the target material is a ferromagnetic body such as FeCo, an NdFeB material is used as a magnet. Even if such a strong magnet material is used, it is difficult to obtain the magnetic field strength sufficient for discharge ignition of a ferromagnetic target such as FeCo. Even if the height of a magnet material is changed under such conditions, the magnetic field strength on a target cannot be significantly changed to such an extent that the film thickness distribution can be regulated.

In the technique of Patent Document 2, for example when a ferromagnetic body is used as a target material, a magnetic field line easily passes through the inside of the target, and therefore, a magnetic track has such a shape that the corners are shortcutted. Therefore, only by providing the T-shaped portions at the both ends of the center magnet, the magnetic track length cannot be adjusted. When the magnetic track length at the both ends of the target is increased, the length A in the width direction of the T-shaped portion should be increased as shown in FIG. 16; however, the length A is limited by a magnet width B.

An object of the present invention is to provide a magnet unit, which can realize uniform film thickness distribution of a thin film formed on a substrate regardless of magnetic characteristic of a target and without increasing the length and width of the target, and a magnetron sputtering apparatus.

Means for Solving the Problem

In order to achieve the above object, the present invention has the following structure.

The present invention provides a magnet unit for a magnetron sputtering apparatus. The magnet unit comprises on the back side of a cathode electrode which supports a rectangular target, a yoke formed of a ferromagnetic plate material, an annular peripheral magnet disposed on the yoke so as to follow the outline of the target, and an inner magnet disposed inside the peripheral magnet on the yoke and having a polarity different from the polarity of the peripheral magnet. The magnet unit forms a magnetic track as a set of regions which a tangent of a magnetic field line generated on the target by the peripheral magnet and the inner magnet parallels to a surface of the target. The magnet unit is characterized by including n (n is a positive integer of two or more) extending magnetic pole portions that extend from the central portion of the inner magnet toward the both sides in its longitudinal direction and are adjacent to the both ends in the longitudinal direction of the peripheral magnet and n−1 projecting magnetic pole portions that protrude inward in the longitudinal direction of the peripheral magnet from the inside of both ends of the peripheral magnet and are located between the n extending magnetic pole portions. The magnet unit is further characterized in that the n extending magnetic pole portions and the n−1 projecting magnetic pole portions form 2n−1 folded shape portions at the both ends in the longitudinal direction of the magnetic track.

Effect of the Invention

According to the present invention, by virtue of the n extending magnetic pole portions of the inner magnet and the n−1 projecting magnetic pole portions of the peripheral magnet, the 2n−1 folded shape portions are formed at the both ends in the longitudinal direction of the magnetic track. Thus, by virtue of the 2n−1 folded shape portions, the magnetic field lines at the both ends in the longitudinal direction of the magnetic track are reinforced. Consequently, regardless of the magnetic characteristics of the target and without increasing the length of the target, the film thickness distribution of a thin film formed on the substrate can be uniformed.

BRIEF DESCRIPTION OF THE DRAWINGS

FIG. 1 is a pattern diagram showing a schematic constitution of a magnetron sputtering apparatus according to the present invention;

FIG. 2 is a schematic diagram showing an example of a mechanism for allowing passage of a substrate;

FIG. 3 is a schematic diagram showing another example of a mechanism for allowing passage of a substrate;

FIG. 4 is a plan view showing a constitution of a magnet unit of a first embodiment;

FIG. 5 is an explanatory view showing formation conditions of magnetic field lines of a general magnet unit;

FIG. 6 is an explanatory view showing a magnetic track formed by the magnet unit of the first embodiment;

FIG. 7 is a plan view showing a constitution of a magnet unit of a second embodiment;

FIG. 8 is an explanatory view showing a relevant portion of a magnetic track formed by the magnet unit of the second embodiment;

FIG. 9 is an explanatory view showing a condition that a non-erosion area of the second embodiment is reduced in size relative to the first embodiment;

FIG. 10 is an explanatory view showing the film-formation conditions in an example 1, comparing with the prior art technique;

FIG. 11 is an explanatory view showing a dimension relation between a target and a substrate;

FIG. 12 is an explanatory view showing the film-formation conditions in an example 2, comparing with the prior art technique;

FIG. 13 is a plan view showing a constitution of a variation of the magnet unit of the second embodiment;

FIG. 14 is a cross-sectional pattern diagram showing a structure of a general CIS solar battery;

FIG. 15 is an explanatory view showing the prior art magnetron sputtering apparatus that forms a film on a substrate while passing the substrate through the front of a target; and FIG. 16 is a plan view showing a relevant portion of a magnet unit of Patent Document 2.

BEST MODE FOR CARRYING OUT THE INVENTION

Hereinafter, embodiments of the present invention will be described with reference to the drawings. However, the present invention is not limited to the embodiments.

First, a magnetron sputtering apparatus according to the present invention will be described with reference to FIGS. 1 to 3. A magnetron sputtering apparatus 1 (hereinafter referred to as a "sputtering apparatus") of this embodiment is common to magnetron sputtering apparatuses each mounted with first and second magnet units 10 and 50 to be described later. FIG. 1 is a pattern diagram showing a schematic constitution of the magnetron sputtering apparatus according to the present invention. FIG. 2 is a schematic diagram showing an example of a mechanism for allowing passage of a substrate. FIG. 3 is a schematic diagram showing another example of a mechanism for allowing passage of a substrate.

As shown in FIG. 1, the magnetron sputtering apparatus 1 of this embodiment comprises a vacuum vessel 2 isolating a vacuum evacuatable processing chamber. The vacuum vessel 2 has an exhaust port 3 connected to an exhauster such as an exhaust pump through, for example, a conductance valve (not shown). Also, the vacuum vessel 2 is connected to a gas introduction system 4 used as means for introducing a process gas and comprising a flow controller. A predetermined flow amount of process gas is supplied from the gas introduction system 4. The process gas includes a single gas or a mixed gas containing a noble gas, such as argon (Ar), and nitrogen ($N_2$). The vacuum vessel 2 includes a stage 5 supporting a substrate and a cathode electrode (not shown) disposed so as to face the substrate and supporting a target 6 on the front side.

The target 6 supported on the front side of the cathode electrode can be formed of a single compositional material such as tantalum (Ta), copper (Cu), and titanium (Ti) or a complex compositional material comprising two or more compositions such as GeSbTe and NiFe. The target 6 may be a nonmagnetic material such as Ta and Cu or a magnetic material such as NiFe. The target 6 of this embodiment is, for example, a rectangular plate material and is joined to the front surface (lower surface) of the cathode electrode body.

The cathode electrode is connected to, for example, a high-frequency power source capable of applying a variable voltage through a matching circuit (not shown). The magnet unit 10 is disposed on the back side of the cathode electrode, and by virtue of the magnet unit 10, a plasma with a high density can be formed. Namely, in the sputtering apparatus 1 of this embodiment, the process gas is introduced into the processing chamber in the vacuum vessel 2, a high voltage from, for example, a high-frequency power source (an electric power for electric discharge) is applied to the cathode electrode, and, at the same time, a magnetic field is provided for the cathode electrode by the magnet unit 10. According to this constitution, the sputtering apparatus 1 generates a plasma in the processing chamber and forms a thin film of a target material on a substrate. Naturally, a plasma may be generated by DC discharge, pulse discharge, or the like. The detailed structure of the magnet unit 10 will be described later.

As shown in FIG. 2, a conveyance mechanism 15 for allowing the substrate to pass through is arranged in front of the target 6. The substrate conveyance mechanism 15 is constituted of a strip-shaped guide rail, for example. The guide rail 15 extends to the direction perpendicular to the longitudinal direction of the target 6 and supports a plurality of substrates 7 thereon to guide the substrates 7 onto the stage 5 in sequence. Then, the sputtering apparatus 1 of this embodiment forms a film on the substrate 7 as a target to be processed while allowing the substrate 7 to pass through the front of the target 6. In the sputtering apparatus 1, sputtering and conveyance of a substrate can be simultaneously performed. The stage 5 may have built in a heating mechanism (not shown) such as a heater.

As the substrate 7, a semiconductor wafer is used, for example. The substrate alone is guided on the guide rail, or it is guided thereon while being mounted on a tray.

As shown in FIG. 3, a substrate conveyance mechanism 25 may be constituted of, for example, a stage rotating mechanism for rotating the circular stage 5, supporting the substrate 7, along the surface of a circle whose tangent is the placement surface of the stage 5. In this example, the stage 5 has a rotation shaft 25A extending in parallel to the longitudinal direction of the rectangular target 6, and the stage 5 is rotated around the axis of the rotation shaft 25A, whereby the substrate 7 passes through the front of the target 6.

First Embodiment

Next, the magnet unit 10 of the first embodiment mounted in the sputtering apparatus 1 will be described with reference to FIG. 4. FIG. 4 is a plan view showing a constitution of the magnet unit of the first embodiment.

As shown in FIG. 4, the magnet unit 10 of this embodiment includes a yoke 20 on the back side of the cathode electrode. The yoke 20 has the same shape (rectangular shape) as the target 6 and is formed of a ferromagnetic plate material. The yoke 20 includes thereon with an annular peripheral magnet 30 disposed along the contour of the target 6 and an inner magnet 40 disposed in the peripheral magnet 30 and having a polarity different from the polarity of the peripheral magnet 30.

As described above, a main body (a first magnetic pole) 31 of the peripheral magnet 30 is formed into an annular shape (a rectangular frame shape) so as to follow the contour of the target 6.

The inner magnet 40 disposed in the main body (the first magnetic pole) 31 of the peripheral magnet 30 extends from the center toward the both sides in the longitudinal direction and includes n extending magnetic pole portions 41 adjacent to the both ends in the longitudinal direction of the peripheral magnet 30. Specifically, the inner magnet 40 includes n magnetic pole long pieces (third magnetic poles) 42 each having the extending magnetic pole portions 41 at the both ends. In this embodiment, the two third magnetic poles 42 pass through the center CL in the longitudinal direction of the peripheral magnet 30 and are disposed in parallel with each other along the longitudinal direction of the peripheral magnet 30.

The inner magnet 40 includes binding magnetic pole pieces (fourth magnetic poles) 43 connecting the n magnetic pole long pieces (the third magnetic poles) 42 to each other. In this embodiment, the two third magnetic poles 42 are disposed at an interval and connected to each other at an interval through the two fourth magnetic poles 43. The magnetic pole long pieces (the third magnetic poles) 42 and the binding magnetic poles pieces (the fourth magnetic poles) 43 have the same polarity.

The main body (the first magnetic pole) 31 of the peripheral magnet 30 has on the inside of both ends n−1 projecting magnetic pole portions (second magnetic poles) 32 protruding inward in the longitudinal direction of the peripheral magnet 30 so as to be located between the n extending magnetic pole portions 41. In this embodiment, the two extending magnetic pole portions 41 are disposed at each end, and therefore, each one of the projecting magnetic pole portions (the second magnetic poles) 32 protrudes toward the inside of both ends of the inner magnet 40.

Namely, in the magnet unit 10 of the first embodiment, the peripheral magnet 30 constitutes a first magnet assembly, and the inner magnet 40 constitutes a second magnet assembly. The first and second magnet assemblies have different polarities from each other.

Next, the operation of the magnet unit 10 of the first embodiment will be described with reference to FIGS. 4 to 6. FIG. 5 is an explanatory view showing formation conditions of magnetic field lines of a general magnet unit. FIG. 6 is an explanatory view showing a magnetic track formed by the magnet unit of the first embodiment. In FIG. 5, the target 6 and the magnet unit 10 are turned upside down.

As shown in FIG. 5A, by virtue of the peripheral magnet 30 and the inner magnet 40, a large number of curved magnetic field lines (magnetrons) M are generated on the front surface of the target 6. As shown in FIG. 5B, they provide a magnetic track MT that is a set of regions which tangents of the magnetic field lines M generated on the target 6 parallels to the target surface.

In the magnet unit according to the present invention, as shown in FIG. 4, the n extending magnetic pole portions 41 extend at the both ends of the inner magnet 40, and the n−1 projecting magnetic pole portions 32 are provided on the inside of both ends of the peripheral magnet 30 and protrude inward in the longitudinal direction of the peripheral magnet 30. Thus, the n extending magnetic pole portions 41 and the n−1 projecting magnetic pole portions 32 form 2n−1 folded shape portions at the both ends in the longitudinal direction of the magnetic track MT. In the magnet unit 10 of this embodiment, the two extending magnetic pole portions 41 and the one projecting magnetic pole portion 32 are alternately disposed at each end, and therefore, as shown in FIG. 6, three wavy folded shape portions U are formed at the both ends in the longitudinal direction of the magnetic track MT.

In this embodiment, the numbers of the extending magnetic pole portions 41, the projecting magnetic pole portions 32, and the folded shape portions U are examples, and a positive integer of two or more is substituted for n, whereby the present invention is perceived. For example, when three extending magnetic pole portions 41 are provided, the number of the projecting magnetic pole portions 32 located between the extending magnetic pole portions 41 adjacent to each other is two, and thus five folded shape portions U are formed at the both ends in the longitudinal direction of the magnetic track MT. Likewise, when four extending magnetic pole portions 41 are provided, the number of the projecting magnetic pole portions 32 located between the extending magnetic pole portions 41 adjacent to each other is three, and thus seven folded shape portions U are formed at the both ends in the longitudinal direction of the magnetic track MT.

As described above, according to the magnet unit 10 of the first embodiment, the length of the magnetic track can be adjusted without changing the width and length of the target. Namely, in this embodiment, the magnetic pole long pieces (the third magnetic poles) 42 having the extending magnetic pole portions 41 at the both ends are continued, and therefore, the protruding length of the projecting magnetic pole portions (the second magnetic poles) 32 each provided on the inside of both ends of the peripheral magnet 30 is suitably changed, whereby the length of the magnetic track at the both ends of the target can be increased. In the central region of the target 6, a pair of the two inner magnets 40 is arranged in parallel to the peripheral magnet 30, whereby a powerful magnetic field can be generated in the central region of the target 6.

Thus, by virtue of the 2n–1 folded shape portions U, the magnetic field lines at the both ends in the longitudinal direction of the magnetic track MT is reinforced, and thus regardless of the magnetic characteristics of the target 6 and without increasing the length of the target 6, the film thickness distribution of a thin film formed on the substrate 7 can be uniformed.

When the magnet unit 10 of this embodiment is mounted in the sputtering apparatus 1 in which the substrate 7 can be conveyed in a direction perpendicular to the longitudinal direction of the target 6, the reduction in film thickness of the outer peripheral portion of the substrate corresponding to the longitudinal direction of the target 6 can be suppressed.

Second Embodiment

Next, a magnet unit 50 of a second embodiment mounted in the sputtering apparatus 1 will be described with reference to FIG. 7. FIG. 7 is a plan view showing a constitution of the magnet unit of the second embodiment. In the following description of the second embodiment, the same components as those in the first embodiment are assigned with the same reference numerals.

As shown in FIG. 7, in the magnet unit 50 of the second embodiment, a yoke 20 and a peripheral magnet 30 each have the same structure as those of the first embodiment. Namely, the magnet unit 50 includes the yoke 20 on the back side of the cathode electrode. The yoke 20 has the same shape (rectangular shape) as a target 6 and is formed of a ferromagnetic plate material. A main body (a first magnetic pole) 31 of the peripheral magnet 30 is formed into a rectangular frame shape so as to follow the contour of the target 6. The main body (the first magnetic pole) 31 of the peripheral magnet 30 has on the inside of both ends n–1 projecting magnetic pole portions (second magnetic poles) 32 protruding inward in the longitudinal direction of the peripheral magnet 30.

An inner magnet 40 comprises, at the central portion in the peripheral magnet 30, a central magnetic pole short piece (a fifth magnetic pole) 62 disposed along the longitudinal direction. In this embodiment, although the central magnetic pole short piece 62 is a single magnetic pole material, a plurality of the central magnetic pole short pieces 62 may be provided in parallel with each other. The both ends of the central magnetic pole short piece 62 and n extending magnetic pole portions (third magnetic poles) 41 are connected in a branching structure through branched portion magnetic pole pieces (fourth magnetic poles) 63. The branched portion magnetic pole piece (the fourth magnetic pole) 63 and the central magnetic pole short piece (the fifth magnetic pole) 62 have a C shape, and each of the extending magnetic pole portions 41 is disposed in parallel along the longitudinal direction of the peripheral magnet 30. As shown in FIG. 13, two branched portion magnetic pole pieces (the fourth magnetic poles) 63 may be disposed in a V shaped manner.

Namely, the inner magnet 40 includes the n extending magnetic pole portions (the third magnetic poles) 41 provided at the both ends of the central magnetic pole short piece (the fifth magnetic pole) 62 through the branched portion magnetic pole piece (the fourth magnetic pole) 63, and the n–1 projecting magnetic pole portions (the second magnetic poles) 32 of the peripheral magnet 30 protrude between the n third magnetic poles 41. In this embodiment, the two third magnetic poles 41 are branched and extended from each end of the fifth magnetic pole 62 through the fourth magnetic pole 63, and the second magnetic pole 32 of the peripheral magnet 30 protrudes between the third magnetic poles 41. The fifth magnetic pole 62, the fourth magnetic pole 63, and the third magnetic pole 41 constituting the inner magnet 40 have the same polarity.

Namely, in the magnet unit 50 of the second embodiment, the peripheral magnet 30 constitutes a first magnet assembly, and the inner magnet 40 constitutes a second magnet assembly. The first and second magnet assemblies have different polarities from each other.

Next, the operation of the magnet unit 50 of the second embodiment will be described with reference to FIGS. 8 and 9. FIG. 8 is an explanatory view showing a relevant portion of a magnetic track formed by the magnet unit of the second embodiment. FIG. 9 is an explanatory view showing a condition that a non-erosion area of the second embodiment is reduced in size relative to the first embodiment.

As described above, in the magnet unit according to the present invention, the n extending magnetic pole portions 41 extend at the both ends of the inner magnet 40, and the n–1 projecting magnetic pole portions 32 are provided on the inside of both ends of the peripheral magnet 30 and protrude inward in the longitudinal direction of the peripheral magnet 30. Thus, as shown in FIG. 8, the n extending magnetic pole portions 41 and the n–1 projecting magnetic pole portions 32 form 2n–1 folded shape portions U at the both ends in the longitudinal direction of the magnetic track MT. In the magnet unit 50 of this embodiment, the two extending magnetic pole portions 41 and the one projecting magnetic pole portion 32 are alternately disposed at each end, and therefore, three wavy folded shape portions U are formed at the both ends in the longitudinal direction of the magnetic track MT.

In this embodiment, the numbers of the extending magnetic pole portions 41, the projecting magnetic pole portions 32, and the folded shape portions U are examples, and a positive integer of two or more is substituted for n, whereby the present invention is perceived. For example, when three extending magnetic pole portions 41 are provided, the number of the projecting magnetic pole portions 32 located between the extending magnetic pole portions 41 adjacent to each other is two, and thus five folded shape portions U are formed at the both ends in the longitudinal direction of the magnetic track MT. Likewise, when four extending magnetic pole portions 41 are provided, the number of the projecting magnetic pole portions 32 located between the extending magnetic pole portions 41 adjacent to each other is three, and thus seven folded shape portions W are formed at the both ends in the longitudinal direction of the magnetic track MT.

As described above, according to the magnet unit 50 of the second embodiment, the length of the magnetic track can be adjusted regardless of the magnetic characteristics of the target and without increasing the width and length of the target. Namely, in this embodiment, an extending length D of the extending magnetic pole portions (the third magnetic poles) 41 at the both ends of the inner magnet 40 and a protruding length C of the projecting magnetic pole portions (the second magnetic poles) 32 provided on the inside of both ends of the peripheral magnet 30 are suitably changed, whereby the magnetic track length at the both ends of the target can be increased. Namely, the extending length D of the third magnetic pole 41 and the protruding length CD of the second magnetic pole 32 are increased, whereby the magnetic track length at the both ends of the target can be increased, and thus it is unnecessary to change the size of the target 6.

Especially, in the magnet unit 50 of the second embodiment, when the single central magnetic pole short piece 62 (the fifth magnetic pole) is provided, the interval between the peripheral magnet 30 and the fifth magnetic pole 62 is increased. According to this constitution, as shown in FIG. 9, relative to the magnet unit 10 of the first embodiment, the magnetic track approaches the central portion of the minor axis of the target, and therefore, a plasma existence region is moved near the target minor axis central portion to reduce the non-erosion area N.

As described above, according to the magnet units 10 and 50 of the first and second embodiments, compared with the prior art magnet unit, the length of an erosion track at the both ends in the longitudinal direction of the target can be increased. Thus, according to the magnet units 10 and 50 of the first and second embodiments, the number of sputtered particles from the both ends in the longitudinal direction of the target is larger than that in the prior art magnet unit, whereby the deterioration of the film thickness distribution in a region A due to reduction of the film thickness can be suppressed.

In order to increase the utilization efficiency of the target, the magnet units 10 and 50 may be swung along the longitudinal direction.

EXAMPLES

Hereinafter, the present invention will be described in detail rising examples; however, the invention is not limited to the examples.

Example 1

In an example 1, the sputtering apparatus 1 of FIG. 1 and the conveyance mechanism (guide rail) 15 of FIG. 2 are used, a plurality of silicon substrates are supported on the guide rail, the guide rail is moved in a direction perpendicular to the longitudinal direction of a target, and a titanium nitride film is then formed on each substrate.

Titanium (Ti) is used as the target 6 supported by a cathode electrode, and a mixed gas composed of Ar and $N_2$ as a process gas is introduced into the vacuum vessel 2.

FIG. 10 is an explanatory view showing the film-formation conditions in the example 1, comparing with the prior art technique. As shown in FIGS. 10A and 10C, when the prior art magnet unit is mounted in the sputtering apparatus 1, the film thickness of the peripheral portion of the substrate corresponding to the both ends in the longitudinal direction of the target 6 is reduced.

Meanwhile, as shown in FIGS. 10B and 10D, when the magnet unit 10 is mounted in the sputtering apparatus 1, the folded shape portions U are formed at the both ends of the magnetic track MT. Consequently, the length of the magnetic track is increased to reinforce the magnetic field lines at the both ends of the magnetic track MT, whereby the reduction of the film thickness of the peripheral portion of the substrate corresponding to the both ends in the longitudinal direction of the target 6 can be suppressed.

As described above, by virtue of the use of the magnet unit 10 of the present invention, the magnetic field strength on the both sides in the longitudinal direction of the target 6 is increased, and the magnetic field strength at the center is reduced. Thus, the number of sputtered particles from the both sides in the longitudinal direction of the target 6 is relatively increased, and the distribution of the thickness of a film deposited on a passing substrate is improved without increasing the length of the target 6.

FIG. 11 is an explanatory view showing a dimension relation between a target and a substrate.

When film formation with a favorable film thickness distribution is performed in the prior art technique, such a dimension that W/P 2.8, W/D to 4.5, and W/T 7 is generally used.

For example, P=200 mm, W=600 mm, D=130 mm, and T=80 mm.

On the contrary, when the present invention is applied, by virtue of such a dimension relation that 2.5≧W/P≧1.7, W/D to 4.5, and 6.3≧W/T≧4.3, the distribution of Range/Mean<3% can be obtained. Namely, this means that by virtue of the effect of increasing the magnetic field strength at the both ends, the target width (W) is reduced to enable the running cost to be reduced.

Example 2

In an example 2, the sputtering apparatus 1 shown in FIG. 1 and the conveyance mechanism (rotation mechanism) 25 shown in FIG. 3 are used, a silicon substrate is supported on the stage 5, the substrate 7 is moved in a direction perpendicular to the longitudinal direction of the target 6 by means of the rotation mechanism 25, and a tantalum nitride film is then formed on each of the substrates 7.

Tantalum (Ta) is used as the target 6 supported by a cathode electrode, and a mixed gas composed of Ar and $N_2$ as a process gas is introduced into the vacuum vessel 2.

FIG. 12 is an explanatory view showing the film-formation conditions in the example 2, comparing with the prior art technique. As shown in FIG. 12A, when the prior art magnet unit is mounted in the sputtering apparatus 1, the width of a short cut portion S of the magnetic track MT is reduced, and therefore, the thickness of a film at the peripheral portion of a substrate corresponding to the both ends in the longitudinal direction of the target 6 is reduced.

Meanwhile, as shown in FIG. 12B, when the magnet unit 50 is mounted in the sputtering apparatus 1, the folded shape portions U are formed at the both ends of the magnetic track MT. Consequently, the length of the magnetic track MT is increased to increase the width of the short cut portion S, and the magnetic field line at the both ends of the magnetic track MT is reinforced, whereby the reduction of the film thickness at the peripheral portion of a substrate corresponding to the both ends in the longitudinal direction of the target 6 can be suppressed.

As described above, by virtue of the use of the magnet unit 50 of the present invention, the magnetic field strength on the both sides in the longitudinal direction of the target 6 is increased, and the magnetic field strength at the center is reduced. Thus, the number of sputtered particles from the both sides in the longitudinal direction of the target 6 is relatively increased, and the distribution of the thickness of a film deposited on a passing substrate is improved without increasing the length of the target 6.

The sputtering apparatus according to the present invention can be used not only in the film-formation of the nitride films shown in the examples 1 and 2 but also, for example, in manufacturing of a solar battery. A recently noticeable CIS solar battery will be described as an example. FIG. 14 is a cross-sectional pattern diagram showing a structure of a general CIS solar battery. The sputtering apparatus of the present invention can be used in the film formation of a lower electrode 102 (for example, an Mo film) on a substrate 101, the film formation of a p-type semiconductor layer 103 (for example, Cu(In, Ga)$Se_2$) on the lower electrode 102, and the film formation of a transparent electrode 105 (for example, ITO (Indium Tin Oxide)) on an n-type semiconductor layer 104 (for example, CdS) formed by, for example, an evaporation method. In addition, for example when sputtering film formation can be applied to an antireflection film 106, the sputtering apparatus of the present invention can be used. A plurality of the magnet units of the present invention are arranged vertical to the longitudinal direction, and they are swung, whereby uniform film formation on a large-size substrate can be realized.

INDUSTRIAL APPLICABILITY

The present invention is applicable not only to the exemplified magnetron sputtering apparatus but also to a plasma treatment apparatus such as a dry etching apparatus, a plasma usher apparatus, a CVD apparatus, and a liquid crystal display producing apparatus. Further, the invention can be developed not only for the exemplified nitride films and solar battery but also for a magnetic material used in film formation in an HDD head process.

EXPLANATION OF REFERENCE NUMERALS

1 Magnetron sputtering apparatus
2 Vacuum vessel
6 Target
7 Substrate
10, 50 Magnet unit
15, 25 Conveyance mechanism
20 Yoke
30 Peripheral magnet
31 Main body (first magnetic pole)
32 Projecting magnetic pole portion (second magnetic pole)
40 Inner magnet
41 Extending magnetic pole portion (third magnetic pole)
42 Magnetic pole long piece (third magnetic pole)
43 Binding magnetic pole pieces (fourth magnetic poles)
62 Central magnetic pole short piece (fifth magnetic pole)
63 Branched portion magnetic pole piece (fourth magnetic pole)
M Magnetic field line
MT Magnetic track
U Folded shape portion

The invention claimed is:

1. A magnet unit for a magnetron sputtering apparatus comprising on the back side of a cathode electrode which supports a rectangular target:
a yoke formed of a ferromagnetic plate material, a peripheral magnet disposed on the yoke so as to follow the outline of the target, and an inner magnet disposed inside the peripheral magnet on the yoke and having a polarity different from the polarity of the peripheral magnet,
wherein the magnet unit forms a magnetic track as a set of regions which a tangent of a magnetic field line generated on the target by the peripheral magnet and the inner magnet parallels to a surface of the target, the magnet unit comprising:
n (n is a positive integer of two or more) extending magnetic pole portions extending from the central portion of the inner magnet toward the both sides in its longitudinal direction and adjacent to the both ends in the longitudinal direction of the peripheral magnet; and
n−1 projecting magnetic pole portions protruding inward in the longitudinal direction of the peripheral magnet from the inside of both ends of the peripheral magnet and located between the n extending magnetic pole portions,
wherein the inner magnet comprises n magnetic pole long pieces, which have the extending magnetic pole portion at the both ends, pass through the central portion in the longitudinal direction of the peripheral magnet, and are disposed in parallel along the longitudinal direction, and binding magnetic pole piece connecting the n magnetic pole long pieces, and the n magnetic pole long pieces and the binding magnetic pole piece have the same polarity, and
wherein the n extending magnetic pole portions and the n−1 projecting magnetic pole portions form 2n−1 folded shape portions at the both ends in the longitudinal direction of the magnetic track.

2. A magnet unit for a magnetron sputtering apparatus comprising on the back side of a cathode electrode which supports a rectangular target:
a yoke formed of a ferromagnetic plate material, a peripheral magnet disposed on the yoke so as to follow the outline of the target, and an inner magnet disposed inside the peripheral magnet on the yoke and having a polarity different from the polarity of the peripheral magnet,
wherein the magnet unit forms a magnetic track as a set of regions which a tangent of a magnetic field line generated on the target by the peripheral magnet and the inner magnet parallels to a surface of the target, the magnet unit comprising:
n (n is a positive integer of two or more) extending magnetic pole portions extending from the central portion of the inner magnet toward the both sides in its longitudinal direction and adjacent to the both ends in the longitudinal direction of the peripheral magnet; and
n−1 projecting magnetic pole portions protruding inward in the longitudinal direction of the peripheral magnet from the inside of both ends of the peripheral magnet and located between the n extending magnetic pole portions,
wherein the inner magnet comprises a central magnetic pole short piece provided at the central portion in the peripheral magnet and disposed along the longitudinal direction and the n extending magnetic pole portions branched and connected to the both ends of the central magnetic pole short piece and disposed in parallel along the longitudinal direction of the peripheral magnet, and the central magnetic pole short piece and the n extending magnetic pole portions have the same polarity, and
wherein the n extending magnetic pole portions and the n−1 projecting magnetic pole portions form 2n−1 folded shape portions at the both ends in the longitudinal direction of the magnetic track.

3. A magnetron sputtering apparatus comprising in a vacuum evacuatable process chamber:
a substrate to be processed;
a cathode electrode disposed so as to face the substrate and receives supply of an electric power for electric discharge;
a target supported on the front side of the cathode electrode; and
a conveyance mechanism for allowing passage of the substrate in front of the target,
wherein the magnet unit according to claim 1 or 2 is disposed on the back side of the cathode electrode.

* * * * *